US010495927B2

(12) United States Patent
Kim et al.

(10) Patent No.: US 10,495,927 B2
(45) Date of Patent: Dec. 3, 2019

(54) DISPLAY DEVICE

(71) Applicant: Samsung Display Co., Ltd., Yongin-si, Gyeonggi-do (KR)

(72) Inventors: Young Gu Kim, Yongin-si (KR); Taek Joon Lee, Hwaseong-si (KR); Hye Lim Jang, Hwaseong-si (KR); Baek Kyun Jeon, Yongin-si (KR); Jin-Soo Jung, Hwaseong-si (KR); Young Bong Cho, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/016,447

(22) Filed: Jun. 22, 2018

(65) Prior Publication Data

US 2019/0064602 A1    Feb. 28, 2019

(30) Foreign Application Priority Data

Aug. 23, 2017    (KR) .................. 10-2017-0106824

(51) Int. Cl.
*G02F 1/1335*    (2006.01)
*H01L 27/32*    (2006.01)
(Continued)

(52) U.S. Cl.
CPC ...... *G02F 1/133617* (2013.01); *G02F 1/1368* (2013.01); *H01L 27/322* (2013.01);
(Continued)

(58) Field of Classification Search
CPC ............. H01L 27/3223; H01L 27/3244; G02F 1/133617; G02F 2202/36
See application file for complete search history.

(56) References Cited

U.S. PATENT DOCUMENTS 9,477,123 B2    10/2016 Inoue et al.
2009/0147497 A1*    6/2009 Nada ................ G02B 6/0023
362/84
(Continued)

FOREIGN PATENT DOCUMENTS

EP    3125032 A1    2/2017
JP    2013-254651 A    12/2013
(Continued)

OTHER PUBLICATIONS

EPO Extended Search Report dated Dec. 4, 2018, for corresponding European Patent Application No. 18190540.7 (13 pages).

*Primary Examiner* — Stephen M Bradley
(74) *Attorney, Agent, or Firm* — Lewis Roca Rothgerber Christie LLP

(57) ABSTRACT

A display device according to an exemplary embodiment includes: a thin film transistor array panel; and a color conversion display panel overlapping the thin film transistor array panel, the color conversion display panel including: a substrate; a color conversion layer positioned between the substrate and the thin film transistor array panel and including a semiconductor nanocrystal; a transparent layer positioned between the substrate and the thin film transistor array panel; and at least one of a first buffer layer positioned between the color conversion layer and the substrate and between the transparent layer and the substrate, and a second buffer layer positioned between the color conversion layer and the thin film transistor array panel and between the transparent layer and the thin film transistor array panel, and at least one of the first buffer layer and the second buffer layer includes a porous layer.

20 Claims, 12 Drawing Sheets

(51) Int. Cl.
*G02F 1/1368* (2006.01)
*G02F 1/1362* (2006.01)

(52) U.S. Cl.
CPC ............... *H01L 27/3244* (2013.01); *G02F 2001/133614* (2013.01); *G02F 2001/136222* (2013.01); *G02F 2202/36* (2013.01); *G02F 2203/023* (2013.01)

(56) References Cited

U.S. PATENT DOCUMENTS

| | | | |
|---|---|---|---|
| 2013/0242228 A1* | 9/2013 | Park | G02F 1/133617 |
| | | | 349/61 |
| 2014/0321101 A1 | 10/2014 | Kadowaki | |
| 2015/0287959 A1* | 10/2015 | Hanamura | H01L 51/5246 |
| | | | 257/40 |
| 2016/0028983 A1* | 1/2016 | Uya | H01L 27/14627 |
| | | | 348/340 |
| 2016/0041430 A1* | 2/2016 | Lee | G02F 1/133617 |
| | | | 349/96 |

FOREIGN PATENT DOCUMENTS

| | | |
|---|---|---|
| KR | 10-2016-0089700 A | 7/2016 |
| KR | 10-2017-0005317 A | 1/2017 |
| KR | 10-2017-0026823 A | 3/2017 |

\* cited by examiner

DISPLAY DEVICE

CROSS-REFERENCE TO RELATED APPLICATION

This application claims priority to and the benefit of Korean Patent Application No. 10-2017-0106824, filed on Aug. 23, 2017 in the Korean Intellectual Property Office, the entire content of which is incorporated herein by reference.

BACKGROUND

1. Field

Aspects of embodiments of the present disclosure relate to a display device.

2. Description of the Related Art

A liquid crystal display may include two field generating electrodes, a liquid crystal layer, a color filter, and a polarization layer. Although light generated from a light source reaches a user through the liquid crystal layer, the color filter, and the polarization layer, there is a problem that light loss is generated in the polarization layer, the color filter, and the like. This light loss may also be generated in a display device such as an organic light emitting diode display and the like, as well as the liquid crystal display.

To realize a display device having high color reproducibility while decreasing light loss, a display device including a color conversion display panel using a semiconductor nanocrystal has been proposed.

The above information disclosed in this Background section is only for enhancement of understanding of the background of the invention and, therefore, it may contain information that does not form the prior art that is already known in this country to a person of ordinary skill in the art.

SUMMARY

According to an aspect of the present disclosure, exemplary embodiments relate to a display device having improved light emission efficiency and color reproducibility.

A display device according to one or more exemplary embodiments includes: a thin film transistor array panel; and a color conversion display panel overlapping the thin film transistor array panel, wherein the color conversion display panel includes a substrate, a color conversion layer positioned between the substrate and the thin film transistor array panel and including a semiconductor nanocrystal, a transparent layer positioned between the substrate and the thin film transistor array panel, and at least one of a first buffer layer positioned between the color conversion layer and the substrate and between the transparent layer and the substrate, and a second buffer layer positioned between the color conversion layer and the thin film transistor array panel and between the transparent layer and the thin film transistor array panel, and at least one of the first buffer layer and the second buffer layer includes a porous layer.

The first buffer layer and the second buffer layer may have a lower refractive index than a refractive index of the color conversion layer and the transparent layer.

The display device may further include a light filter layer positioned between the second buffer layer and the color conversion layer and between the second buffer layer and the transparent layer.

The light filter layer may include a plurality of layers including at least one high refractive index layer and at least one low refractive index layer that are alternately stacked.

The first buffer layer and the second buffer layer may have a different refractive index from a refractive index of the at least one low refractive index layer.

The at least one high refractive index layer may be positioned adjacent to the second buffer layer.

The at least one high refractive index layer may be positioned at a top end and a bottom end of the light filter layer.

The display device may further include an over-coating layer positioned between the second buffer layer and the thin film transistor array panel, and a light filter layer positioned between the second buffer layer and the over-coating layer.

A thickness of the first buffer layer and the second buffer layer may be 100 nm or more.

The thickness of the first buffer layer and the second buffer layer may be 400 nm or more.

A refractive index of the first buffer layer and the second buffer layer may be 1.2 to 1.4.

A refractive index of the first buffer layer and the second buffer layer may be decreased as a number of pores included in the first buffer layer and the second buffer layer is increased.

At least one of the first buffer layer and the second buffer layer may include a silicon oxide, and a refractive index of the first buffer layer and the second buffer layer may be decreased as a number of Si—O bonds included in the first buffer layer and the second buffer layer is decreased.

A display device according to one or more exemplary embodiments includes: a thin film transistor array panel; and a color conversion display panel overlapping the thin film transistor array panel, wherein the color conversion display panel includes a substrate, a color conversion layer positioned between the substrate and the thin film transistor array panel and including a semiconductor nanocrystal, a transparent layer positioned between the substrate and the thin film transistor array panel, and at least one of a first buffer layer positioned between the color conversion layer and the substrate and between the transparent layer and the substrate, and a second buffer layer positioned between the color conversion layer and the thin film transistor array panel and between the transparent layer and the thin film transistor array panel, and total reflection of light is generated at at least one of an interface between the color conversion layer and the first buffer layer and an interface between the color conversion layer and the second buffer layer.

One of the first buffer layer and the second buffer layer may include a porous inorganic material, and the other of the first buffer layer and the second buffer layer may include an organic layer including an inorganic particle.

The inorganic particle may include at least one among hollow silica, a pore derivative, and a silica cluster.

According to an aspect of exemplary embodiments, a display device having improved light emission efficiency and color reproducibility is provided.

DESCRIPTION OF SYMBOLS

Figure 1:
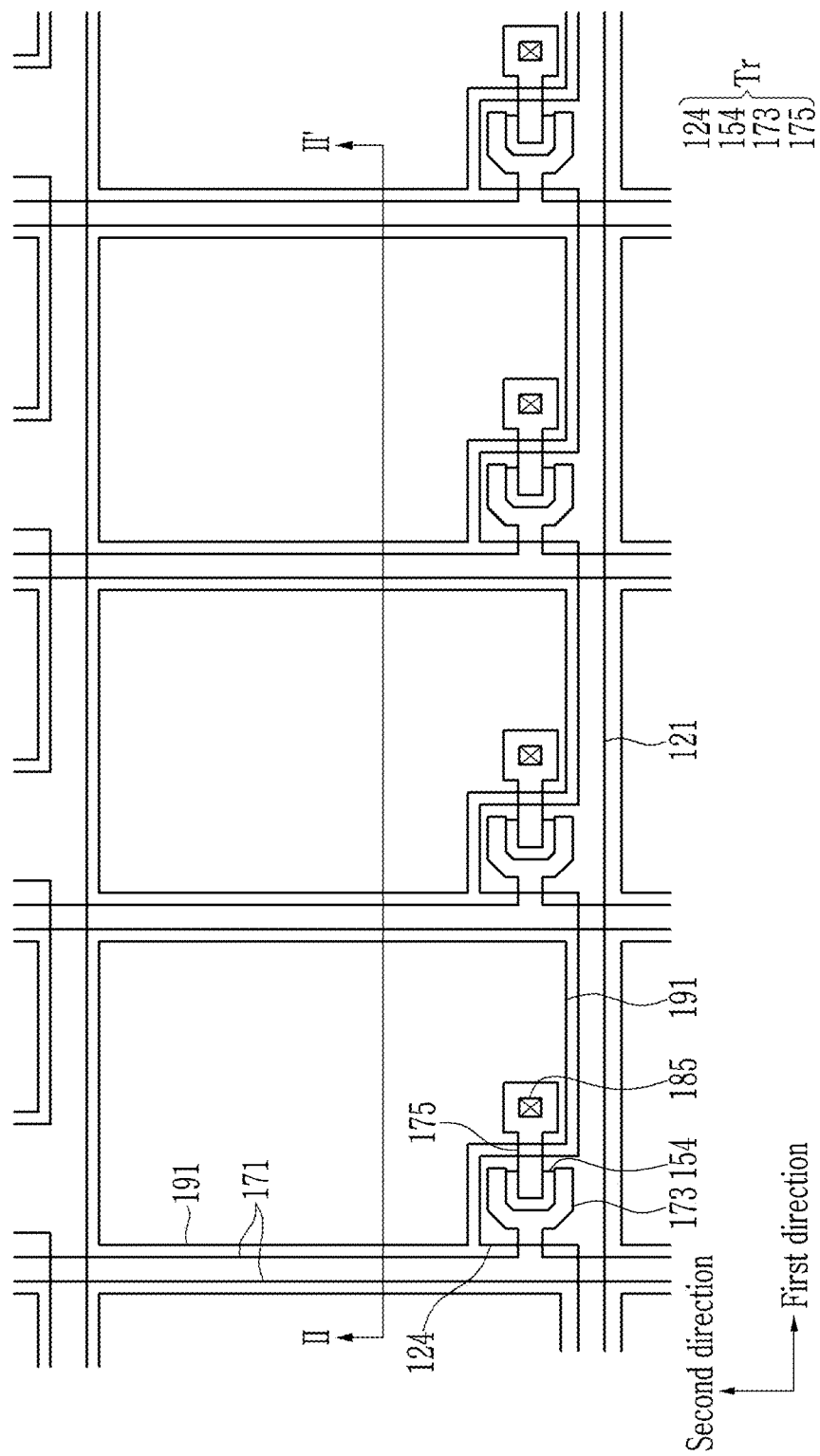
FIG. 1 is a top plan view of a pixel of a display device according to an exemplary embodiment.

100: thin film transistor array panel
30: color conversion display panel
330R, 330G: color conversion layer
330B: transparent layer
327: first buffer layer
347: second buffer layer

DETAILED DESCRIPTION

The present invention will be described more fully herein with reference to the accompanying drawings, in which some exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, since sizes and thicknesses of constituent members shown in the accompanying drawings may be arbitrarily shown for better understanding and ease of description, the present invention is not limited thereto. In the drawings, the thicknesses of layers, films, panels, regions, etc. may be exaggerated for clarity. In the drawings, for better understanding and ease of description, the thicknesses of some layers and areas may be exaggerated.

It is to be understood that when an element such as a layer, film, region, or substrate is referred to as being "on" another element, it can be directly on the other element or one or more intervening elements may also be present. In contrast, when an element is referred to as being "directly on" another element, there are no intervening elements present. Further, in the specification, the words "on" or "above" mean positioned on or below the object portion, and do not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "on a plane" means viewing the object portion from the top, and the phrase "on a cross-section" means viewing a cross-section of which the object portion is vertically cut from the side.

Figure 2:
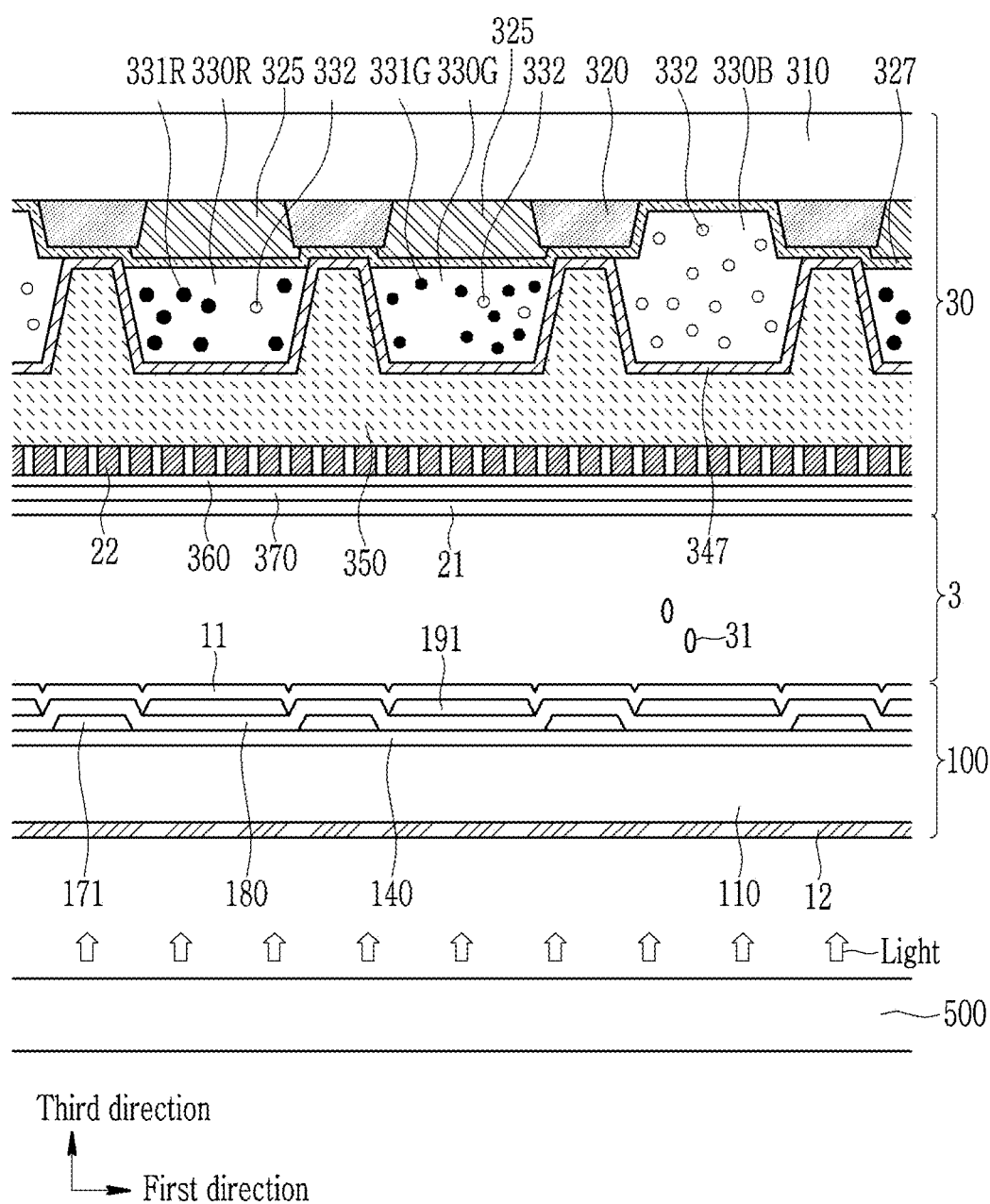
FIG. 2 is a cross-sectional view taken along a line II-II' of FIG. 1.

A display device according to an exemplary embodiment of the present invention will be described with reference to FIG. 1 and FIG. 2. FIG. 1 is a top plan view of a pixel of a display device according to an exemplary embodiment; and FIG. 2 is a cross-sectional view taken along a line II-II' of FIG. 1.

A display device according to an exemplary embodiment includes a light unit 500, a thin film transistor array panel 100, a color conversion display panel 30 separated or spaced from and overlapping the thin film transistor array panel 100, and a liquid crystal layer 3 positioned between the thin film transistor array panel 100 and the color conversion display panel 30.

The light unit 500 is positioned on a rear surface of the thin film transistor array panel 100 according to a third direction. The light unit 500 may include a light source generating light and a light guide (not shown) receiving the light and guiding the received light toward the thin film transistor array panel 100.

In an embodiment, the light unit 500 may include any light source emitting blue light and may include a light emitting diode (LED), as one example. However, instead of the light unit 500 including the blue light source, the light unit 500 may include a white light source or an ultraviolet ray light source, for example. The display device using the light unit 500 including the blue light source will be described herein.

Also, the light source may be an edge type disposed on at least one side surface of the light guide or a direct type located directly below the light guide, but is not limited thereto.

The thin film transistor array panel 100 includes a first substrate 110 and a first polarization layer 12 positioned between the first substrate 110 and the light unit 500. The first polarization layer 12 polarizes the light incident from the light unit 500.

The first polarization layer 12 may include at least one among a deposited polarization layer, a coated polarization layer, and a wire grid polarization layer; however, embodiments are not limited thereto. The first polarization layer 12 may be formed on a surface of a first substrate 110 by any of various methods, such as in a film form, a coating form, a printing form, and the like; however, embodiments are not limited thereto.

The thin film transistor array panel 100 may include a gate line 121 extending in a first direction between the first substrate 110 and the liquid crystal layer 3 and including a gate electrode 124, a gate insulating layer 140 positioned between the gate line 121 and the liquid crystal layer 3, a semiconductor layer 154 positioned between the gate insulating layer 140 and the liquid crystal layer 3, a data line 171 positioned between the semiconductor layer 154 and the liquid crystal layer 3 and extending in a second direction, a source electrode 173 connected to the data line 171 and a drain electrode 175 separated from the source electrode 173, and a passivation layer 180 positioned between the data line 171 and the liquid crystal layer 3.

The semiconductor layer 154 forms a channel in a part that is not covered by the source electrode 173 and the drain electrode 175, and the gate electrode 124, the semiconductor layer 154, the source electrode 173, and the drain electrode 175 form a thin film transistor Tr.

A pixel electrode 191 is positioned on the passivation layer 180. The pixel electrode 191 may be physically and electrically connected to the drain electrode 175 through a contact hole 185 formed in the passivation layer 180.

A first alignment layer 11 may be positioned between the pixel electrode 191 and the liquid crystal layer 3.

The color conversion display panel 30 includes a substrate 310 overlapping the thin film transistor array panel 100. A light blocking member 320 is positioned between the substrate 310 and the thin film transistor array panel 100.

The light blocking member 320 may be positioned between a red color conversion layer 330R and a green color conversion layer 330G, between a green color conversion layer 330G and a transparent layer 330B, and between a transparent layer 330B and a red color conversion layer 330R, which are described later. Also, the light blocking member 320 may be positioned between red color conversion layers 330R that are adjacent to each other, between green color conversion layers 330G that are adjacent to each other, and between transparent layers 330B that are adjacent to each other. In an embodiment, the light blocking member 320 may have a lattice shape or a straight line shape.

The light blocking member 320 may prevent or substantially prevent mixture of different light emitted from adjacent pixels, and may define a region where the red color conversion layer 330R, the green color conversion layer 330G, and the transparent layer 330B are disposed. The light blocking member 320 may be made of any suitable material to prevent (reflect or absorb) the light.

A blue light cutting filter 325 may be positioned between the substrate 310 and the light blocking member 320, and the thin film transistor array panel 100. The blue light cutting filter 325 may be positioned between the red color conversion layer 330R and the substrate 310 and between the green color conversion layer 330G and the substrate 310. The blue light cutting filter 325 may overlap regions emitting red and green light and may not overlap a region emitting blue light.

The blue light cutting filter 325 includes a first region overlapping the red color conversion layer 330R and a second region overlapping the green color conversion layer 330G, and these regions may be connected to each other. However, embodiments are not limited thereto, and the first region and the second region may be formed to be separated or spaced from each other. In an embodiment, the first region and the second region are positioned to be separated or spaced from each other, and the separated or spaced blue light cutting filters 325 may include different materials from each other.

The blue light cutting filter 325 may block the blue light supplied from the light unit 500. The blue light incident from the light unit 500 to the red color conversion layer 330R and the green color conversion layer 330G is converted into red or green light by semiconductor nanocrystals 331R and 331G, and some blue light is not converted but may be emitted. The blue light emitted without conversion is mixed with the red light or the green light, and thereby color reproducibility may be deteriorated.

The blue light cutting filter 325 may prevent (absorb or reflect) the blue light supplied from the light unit 500 from being emitted through the substrate 310 without absorption in the red color conversion layer 330R and the green color conversion layer 330G.

The blue light cutting filter 325 may include any suitable material to perform the above-described effects, and, as an example, may include a yellow color filter. The blue light cutting filter 325 may have a stacked structure of a single layer or multiple layers.

Although the blue light cutting filter 325 contacting the substrate 310 is shown, embodiments are not limited thereto, and a separate protection layer may be positioned between the substrate 310 and the blue light cutting filter 325.

A first buffer layer 327 is positioned between the blue light cutting filter 325 and the color conversion layers 330R and 330G and between the substrate 310 and the transparent layer 330B. In an embodiment, the first buffer layer 327 may overlap the entire surface of the substrate 310, and may overlap the light blocking member 320, the blue light cutting filter 325, and the substrate 310. The first buffer layer 327 may have a step along a surface of the light blocking member 320, the blue light cutting filter 325, and the substrate 310.

In an embodiment, the first buffer layer 327 may include a material having a lower refractive index than the color conversion layers 330R and 330G and the transparent layer 330B. As one example, the refractive index of the first buffer layer 327 may be about 1.2 to about 1.4.

In an embodiment, the first buffer layer 327 having the lower refractive index than the color conversion layers 330R and 330G and the transparent layer 330B totally reflects the blue light that is not converted into the red light or the green light in the color conversion layers 330R and 330G and is emitted to the side of the substrate 310 to be returned in the direction of the color conversion layers 330R and 330G. In an embodiment, the color conversion layers 330R and 330G have a relatively high refractive index and the first buffer layer 327 has a relatively low refractive index. In the interface of the color conversion layers 330R and 330G and the first buffer layer 327, total reflection of the blue light incident from the color conversion layers 330R and 330G to the first buffer layer 327 may be generated.

The blue light totally reflected at the interface may be incident to a first semiconductor nanocrystal 331R or a second semiconductor nanocrystal 331G to be again emitted as the red light or the green light. The first buffer layer 327 may provide more blue light toward the semiconductor nanocrystals 331R and 331G to increase the light amount of the red light and the green light outside the substrate 310.

The first buffer layer 327 may include any material satisfying the refractive index, and as an example, may include a porous inorganic material. The inorganic material may be a porous silicon oxide (SiOx), as one example. In an embodiment, the first buffer layer 327 may include the organic material including at least one among hollow silica, a pore derivative (porogen), and a silica cluster. In an embodiment, the first buffer layer 327 may have a form in which the inorganic particle is doped to the organic layer.

The first buffer layer 327 may include a plurality of pores in a layer, and hardness and the refractive index of the first buffer layer 327 may decrease as the number of pores increases. As the number of pores increases, Si—O bonding in the first buffer layer 327 decreases such that the crystal structure is not solid or is not complete.

In an embodiment, the first buffer layer 327 including the inorganic material may be formed by a sputtering process. The first buffer layer 327 may be formed to include the pores by controlling a deposition speed of the sputtering process.

As the deposition speed of the process is higher, the porous layer in which the number of pores is higher may be formed. That is, as the deposition speed is higher, it is possible to provide the buffer layer 327 of which the refractive index is lower. According to an exemplary embodiment, the first buffer layer 327 may be deposited at a speed of about 40 Å/s; however, the deposition speed may be changed depending on other deposition conditions (for example, an atmosphere, a pressure, etc.).

In an embodiment, the thickness of the first buffer layer 327 may be about 100 nm or more, and, in an embodiment, about 400 nm or more. As the thickness of the first buffer layer 327 is thicker, the light emission efficiency by the total reflection may increase.

The plurality of color conversion layers 330R and 330G and the transparent layer 330B may be positioned between the first buffer layer 327 and the thin film transistor array panel 100. The color conversion layers 330R and 330G and the transparent layer 330B may be repeatedly arranged along the first direction.

The plurality of color conversion layers 330R and 330G may convert the incident light into light having a different wavelength from the incident light. The plurality of color conversion layers 330R and 330G may include a red color conversion layer 330R and a green color conversion layer 330G.

The transparent layer 330B does not convert the incident light and may emit the incident light as it is. The blue light is incident in the transparent layer 330B, as one example, and the blue light may be emitted as it is.

The red color conversion layer 330R may include the first semiconductor nanocrystal 331R converting the incident blue light into the red light. The first semiconductor nanocrystal 331R may include at least one of a phosphor and a quantum dot.

The green color conversion layer 330G may include a second semiconductor nanocrystal 331G converting the incident blue light into the green light. The second semiconductor nanocrystal 331G may include at least one of a phosphor and a quantum dot.

The quantum dot included in the first semiconductor nanocrystal 331R and the second semiconductor nanocrystal 331G may be independently selected from a Group II-VI compound, a Group III-V compound, a Group IV-VI compound, a Group IV element, a Group IV compound, and a combination thereof.

The Group II-VI compound may be selected from a two-element compound selected from CdSe, CdTe, ZnS, ZnSe, ZnTe, ZnO, HgS, HgSe, HgTe, MgSe, MgS, and a mixture thereof; a three-element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group III-V compound may be selected from a two-element compound selected from GaN, GaP, GaAs, GaSb, AlN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a four-element compound selected from GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a mixture thereof. The Group IV-VI compound may be selected from a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof. The Group IV element may be selected from Si, Ge, and a mixture thereof. The Group IV compound may be a two-element compound selected from SiC, SiGe, and a mixture thereof.

In this case, the two-element compound, the three-element compound, or the four-element compound may be present in particles in uniform concentrations, or may have partially different concentrations in the same particle, respectively. In addition, a core/shell structure in which some quantum dots enclose some other quantum dots may be used. An interface between the core and the shell may have a concentration gradient in which a concentration of an element decreases closer to its center.

In an embodiment, the quantum dots may have a full width at half maximum (FWHM) of a light-emitting wavelength spectrum of about 45 nm or less, and, in an embodiment, about 40 nm or less, and, in an embodiment, about 30 nm or less, and, in this range, the color purity or the color reproducibility may be improved. Also, the light emitted through these quantum dots is emitted in all directions, such that the light viewing angle may be improved.

In an embodiment, the first semiconductor nanocrystal 331R includes a red phosphor, and the red phosphor may include at least one selected from a group including (Ca, Sr, Ba)S, (Ca, Sr, Ba)2Si5N8, CaAlSiN3, CaMoO4, and Eu2Si5N8; however, the present disclosure is not limited thereto.

In an embodiment, the second semiconductor nanocrystal 331G includes a green phosphor, and the green phosphor may include at least one selected from a group including yttrium aluminum garnet (YAG), (Ca, Sr, Ba)2SiO4, SrGa2S4, BAM, α-SiAlON, β-SiAlON, Ca3Sc2Si3O12, Tb3Al5O12, BaSiO4, CaAlSiON, and (Sr(1−x)Bax)Si2O2N2; however, the present disclosure is not limited thereto. In this case, "x" may be any number between 0 and 1.

The transparent layer 330B may pass the incident light as it is. The transparent layer 330B may include a resin passing the blue light. The transparent layer 330B positioned at the region emitting the blue light does not include the separate semiconductor nanocrystal and passes the incident blue light as it is.

Although not shown, the transparent layer 330B may further include at least one of a dye or a pigment. The transparent layer 330B including the dye or pigment decreases the external light reflection, and may provide the blue light with improved color purity.

At least one among the red color conversion layer 330R, the green color conversion layer 330G, and the transparent layer 330B may further include a scattering member 332. A content of each scattering member 332 included in the red color conversion layer 330R, the green color conversion layer 330G, and the transparent layer 330B may be different.

The scattering member 332 increases the amount of light that is converted or passes through the color conversion layers 330R and 330G and the transparent layer 330B and then is emitted, and may uniformly or substantially uniformly provide front luminance and lateral luminance.

The scattering member 332 may include any material that can evenly scatter incident light. As an example, the scattering member 332 may include at least one among TiO2, ZrO2, Al2O3, In2O3, ZnO, SnO2, Sb2O3, and ITO.

The red color conversion layer 330R, the green color conversion layer 330G, and the transparent layer 330B may include a photosensitive resin, as one example, and may be formed through a photolithography process. In an embodiment, the red color conversion layer 330R, the green color conversion layer 330G, and the transparent layer 330B may be formed through a printing process or an inkjet process, and in the case of these processes, the red color conversion layer 330R, the green color conversion layer 330G, and the transparent layer 330B may include a material that is not the photosensitive resin. Herein, the color conversion layer and the transparent layer are described as being formed through the photolithography process, the printing process, or the inkjet process; however, the present disclosure is not limited thereto.

A second buffer layer 347 is located between the color conversion layers 330R and 330G and transparent layer 330B, and the thin film transistor array panel 100. In an embodiment, the second buffer layer 347 may overlap the entire surface of the substrate 310, and may overlap the color conversion layers 330R and 330G and the transparent layer 330B. According to an exemplary embodiment, the first buffer layer 327, the second buffer layer 347, and the light blocking member 320 may overlap each other in a valley formed between the color conversion layers 330R and 330G and the transparent layer 330B adjacent to each other.

In an embodiment, the second buffer layer 347 may include a material (e.g., a same material as the first buffer layer 327) having a lower refractive index than the color conversion layers 330R and 330G and the transparent layer 330B. As one example, the refractive index of the second buffer layer 347 may be about 1.2 to about 1.4.

The color conversion layers 330R and 330G according to an exemplary embodiment include the semiconductor nanocrystals 331R and 331G emitting the light in all directions. The light emitted from the semiconductor nanocrystals 331R and 331G may also be emitted in the direction of the light unit 500 positioned at the rear surface of the display device as well as outside of the substrate 310 where the user is positioned. When not using the light emitted in the light unit 500 direction, the light emission efficiency of the display device may be lower.

However, the display device according to an exemplary embodiment of the present invention includes the second buffer layer 347 having the lower refractive index than the color conversion layers 330R and 330G and the transparent layer 330B. In an embodiment, the total reflection of the light from the color conversion layers 330R and 330G and the transparent layer 330B toward the second buffer layer 347 may be generated in the interface of the color conversion layers 330R and 330G and the second buffer layer 347, and the interface of the transparent layer 330B and the second buffer layer 347. The totally-reflected light is emitted outside the substrate 310, thereby increasing the light emission efficiency of the display device. Also, the totally-reflected light is again incident to the semiconductor nanocrystals 331R and 331G, thereby increasing the conversion efficiency of the light.

The second buffer layer 347 may include any material satisfying the refractive index, and, as one example, may include the porous inorganic material. The inorganic material may be the porous silicon oxide (SiOx), as one example. In an embodiment, the second buffer layer 347 may include the organic material including at least one among hollow silica, a pore derivative (porogen), and a silica cluster. In an embodiment, the second buffer layer 347 may have the form of the inorganic particle doped to the organic layer.

The second buffer layer 347 may include a plurality of pores in a layer, and hardness and the refractive index of the second buffer layer 347 may decrease as the number of pores increases. As the number of pores increases, the Si—O bonding in the second buffer layer 347 decreases such that the crystal structure is not solid or is not complete.

In an embodiment, the second buffer layer 347 including the inorganic material may be formed by a sputtering process. The second buffer layer 347 may be formed to include the pores by controlling a deposition speed of the sputtering process.

As the deposition speed of the process is higher, the porous layer in which the number of pores is larger may be formed. That is, as the deposition speed is higher, the second buffer layer 347 of which the refractive index is lower is possible. According to an exemplary embodiment, the second buffer layer 347 may be deposited with the speed of about 40 Å/s; however, the deposition speed may be changed depending on other deposition conditions (for example, the atmosphere, the pressure, etc.).

In an embodiment, the thickness of the second buffer layer 347 may be about 100 nm or more, and, in an embodiment, may be about 400 nm or more. As the thickness of the second buffer layer 347 is thicker, the light emission efficiency by the total reflection may increase.

Also, the second buffer layer 347 according to an exemplary embodiment of the present invention may prevent or substantially prevent damage to and extinction of the semiconductor nanocrystals 331R and 331G included in the red color conversion layer 330R and the green color conversion layer 330G in the high temperature processes after forming the red color conversion layer 330R, the green color conversion layer 330G, and the transparent layer 330B among the manufacturing process.

The present specification describes the exemplary embodiment in which the color conversion display panel 30 includes the first buffer layer 327 and the second buffer layer 347; however, the color conversion display panel 30 may include at least one of the first buffer layer 327 and the second buffer layer 347. In an embodiment, either one of the first buffer layer 327 and the second buffer layer 347 may be omitted.

An over-coating layer 350 is positioned between the second buffer layer 347 and the thin film transistor array panel 100. In an embodiment, the over-coating layer 350 may overlap the entire surface of the substrate 310.

The over-coating layer 350 may flatten a surface of the red color conversion layer 330R, the green color conversion layer 330G, and the transparent layer 330B. In an embodiment, the over-coating layer 350 includes an organic material; however, it is not limited thereto, and any suitable material having the flattening function may be used.

A second polarization layer 22 may be located between the over-coating layer 350 and the liquid crystal layer 3. The second polarization layer 22 may be at least one among a deposited polarization layer, a coated polarization layer, and a wire grid polarization layer; however, it is not limited thereto, and the second polarization layer 22 may be a wire grid polarization layer including a metal pattern, as one example. The second polarization layer 22 may be formed between the over-coating layer 350 and the liquid crystal layer 3 by any of various methods, such as a film type, a coating type, a printing type, and the like. In an embodiment, the second polarization layer 22 is a wire grid polarization layer, and the second polarization layer 22 may include a plurality of bars having a width of several nanometers.

In an embodiment, an insulating layer 360, a common electrode 370, and a second alignment layer 21 are disposed between the second polarization layer 22 and the liquid crystal layer 3.

The insulating layer 360 as a layer insulating the second polarization layer 22 and the common electrode 370 of a metal material may be omitted when the second polarization layer 22 is not a metal material. The common electrode 370 receiving a common voltage may form an electric field with the above-described pixel electrode 191. The present specification describes a configuration in which the common electrode 370 is positioned in a display panel different from that of the pixel electrode 191; however, it is not limited thereto, and they may be included in the same display panel.

The liquid crystal layer 3 is positioned between the thin film transistor array panel 100 and the color conversion display panel 30, and includes a plurality of liquid crystal molecules 31. It is possible to control transmittance of the light received from the light unit 500 according to the degree of the movement of the liquid crystal molecules 31 and the like.

According to the above-described exemplary embodiment, the blue light emitted without conversion into the red light or the green light may be again returned in the direction of the color conversion layers 330R and 330G through the first buffer layer 327. The blue light may be converted into the red light or the green light by the semiconductor nanocrystals 331R and 331G, thereby again being emitted. Thereby, efficiency of light emission outside the display device may be increased, and the color reproducibility may be improved.

Also, as the light that is not emitted outside the display device and moves to the rear surface of the display device is reflected in the user direction through the second buffer layer 347, the light emission efficiency of the display device may be increased.

Figure 3:
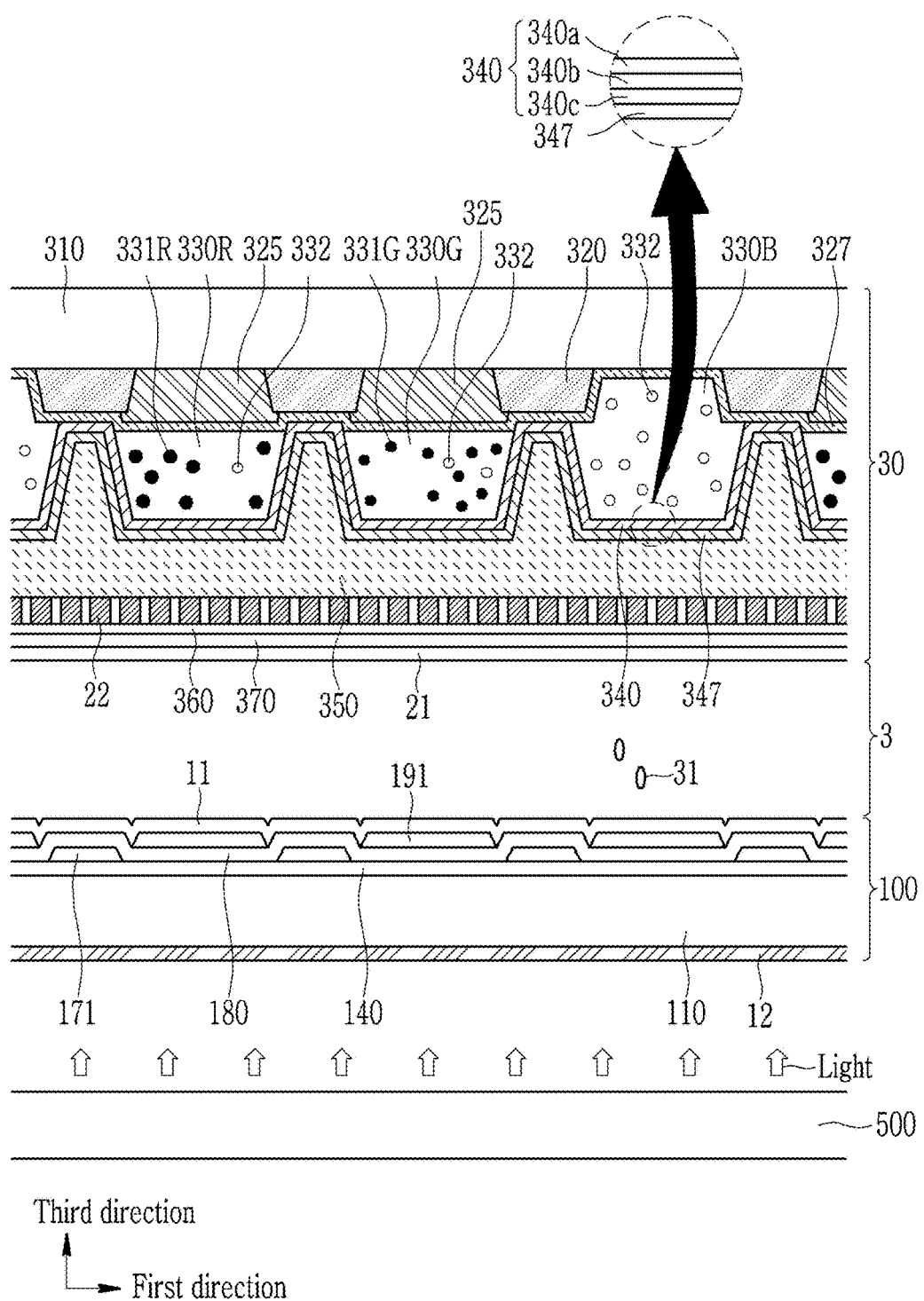
FIG. 3 and FIG. 4 are cross-sectional views taken along a line corresponding to that of FIG. 2 according to various exemplary embodiments, respectively.
Figure 4:
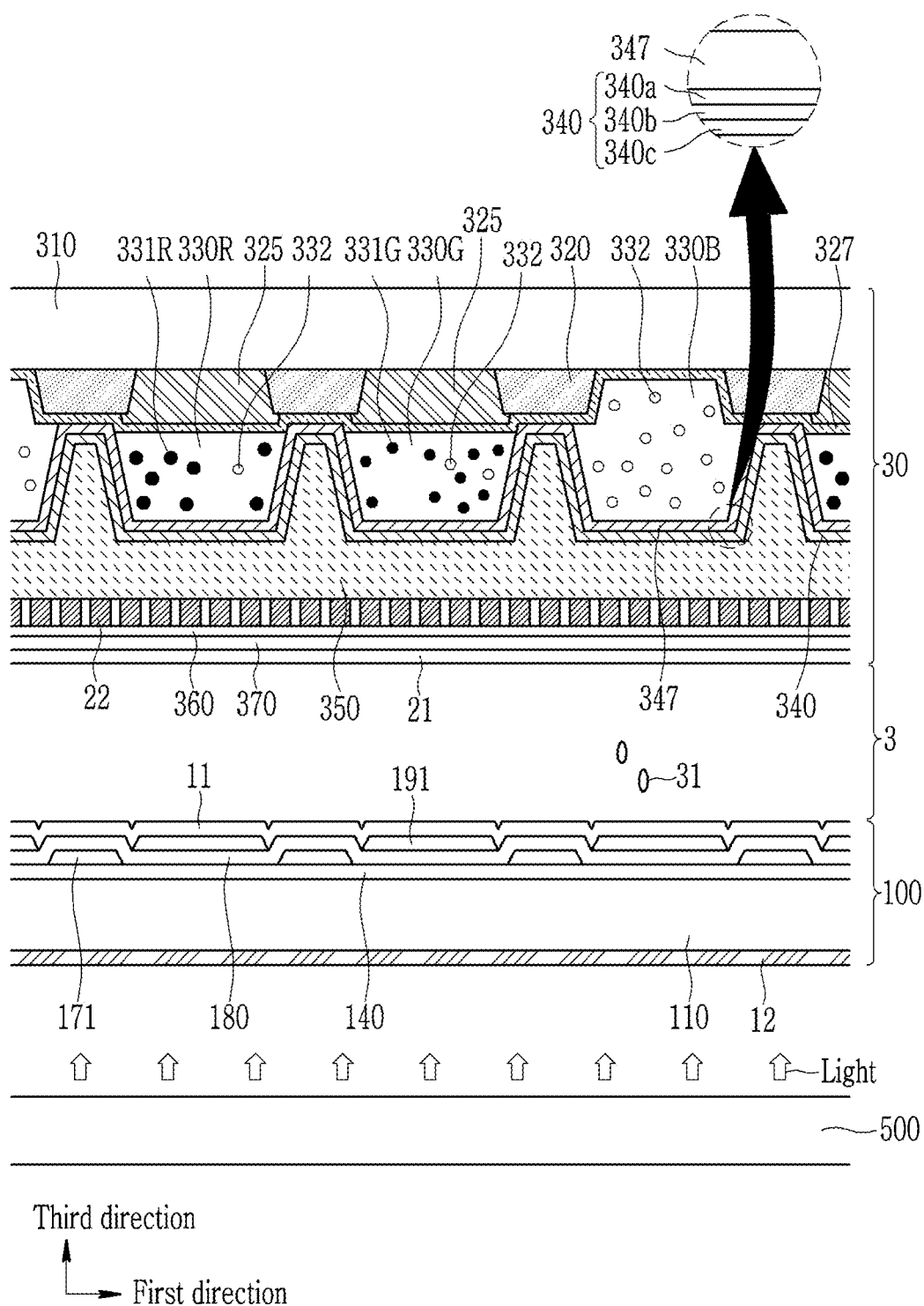

Next, a display device according to various exemplary embodiments of the present invention will be described with reference to FIG. 3 and FIG. 4. FIG. 3 and FIG. 4 are cross-sectional views taken along a line corresponding to that of FIG. 2 according to various exemplary embodiments, respectively. The description of constituent elements that are the same or similar to those described above will be omitted herein.

Referring to FIG. 3, the color conversion display panel 30 according to an exemplary embodiment may further include a light filter layer 340 positioned between the color conversion layers 330R and 330G and the second buffer layer 347 and between the transparent layer 330B and the second buffer layer 347.

The light filter layer 340 may be a filter transmitting light of a particular wavelength (e.g., a predetermined wavelength) and reflecting or absorbing light except for that of the particular wavelength. In an embodiment, the light filter layer 340 may utilize reinforcement and/or offsetting interference between a layer having a high refractive index and a layer having a low refractive index to transmit and/or reflect the particular wavelength as described above.

According to an exemplary embodiment, the light filter layer 340 may reflect the light vertically incident from the color conversion layers 330R and 330G, and the second buffer layer 347 may reflect the light (lateral light) with an angle of more than a threshold angle from the color conversion layers 330R and 330G.

In an embodiment, the light filter layer 340 may include a structure in which high refractive index layers 340a and 340c having a high refractive index and a low refractive index layer 340b having a low refractive index are alternately stacked in plural. The present specification describes an exemplary embodiment in which the light filter layer 340 includes two high refractive index layers 340a and 340c and one low refractive index layer 340b; however it is not limited thereto, and, in an embodiment, the light filter layer 340 may have a structure in which they are alternately stacked from several times to several tens of times.

Among the high refractive index layers 340a and 340c included in the light filter layer 340, according to an exemplary embodiment, the high refractive index layer 340a is positioned to be closest to the color conversion layers 330R and 330G and the transparent layer 330B, and the high refractive index layer 340c is positioned to be closest to the second buffer layer 347. The high refractive index layers 340a and 340c may be positioned at a bottom end and a top end in the stacked structure of the light filter layer 340.

The light filter layer 340 may include at least one among $TiO_2$, $SiN_y$, $SiO_x$, TiN, AlN, $Al_2O_3$, $SnO_2$, $WO_3$, and $ZrO_2$, and may have a structure in which $SiN_y$ and $SiO_x$ are alternately stacked, as one example. In this case, "x" and "y" may be adjusted according to the process conditions for forming the film as an element for determining a chemical composition ratio in $SiN_y$ and $SiO_x$.

In an embodiment, the low refractive index layer 340b included in the light filter layer 340 and the first buffer layer 327 and the second buffer layer 347 having the refractive index of about 1.2 to about 1.4 may have different physical properties from each other. As one example, the low refractive index layer 340b may include a silicon oxide, and the first buffer layer 327 and the second buffer layer 347 may also include a silicon oxide. In an embodiment, the low refractive index layer 340b may have a refractive index of about 1.4, and the first buffer layer 327 and the second buffer layer 347 include the porous layer, thereby having a lower refractive index than about 1.4. Even if the low refractive index layer 340b and the first and second buffer layers 327 and 347 include the same element, the physical properties (e.g., a refractive index, a density, a hardness, etc.) of the film itself may be different from each other.

In an embodiment, referring to FIG. 4, the second buffer layer 347 and the light filter layer 340 may be sequentially positioned between the color conversion layers 330R and 330G and the over-coating layer 350 and between the transparent layer 330B and the over-coating layer 350. The second buffer layer 347 is positioned adjacent to the color conversion layers 330R and 330G and the transparent layer 330B, and the light filter layer 340 is positioned adjacent to the over-coating layer 350.

The second buffer layer 347 may include a material having a relatively low refractive index. The second buffer layer 347 may have a lower refractive index than the color conversion layers 330R and 330G and the transparent layer 330B, and as one example, the refractive index of the second buffer layer 347 may be about 1.2 to about 1.4.

In an embodiment, as the display device according to an exemplary embodiment includes the second buffer layer 347 having the relatively low refractive index, total reflection may be generated in the interface of the color conversion layers 330R and 330G and the second buffer layer 347 and the interface of the transparent layer 330B and the second buffer layer 347. The totally-reflected light is emitted outside the substrate 310, thereby increasing the light emission efficiency of the display device. Also, the totally-reflected light is again incident to the semiconductor nanocrystals 331R and 331G, thereby increasing the conversion efficiency of the light.

In an embodiment, the second buffer layer 347 may include a porous inorganic material. The inorganic material may be a porous silicon oxide ($SiO_x$), as an example. The second buffer layer 347 may include a plurality of pores in a layer, and hardness and the refractive index of the second buffer layer 347 may decrease as the number of pores increases. As the number of pores increases, the Si—O bonding in the second buffer layer 347 decreases such that the crystal structure is not solid or is not complete.

Also, the second buffer layer 347 may include the organic material including at least one among hollow silica, a pore derivative (porogen), and a silica cluster. In an embodiment, the second buffer layer 347 may have the form of which the inorganic particle is doped to the organic layer.

In an embodiment, the thickness of the second buffer layer 347 may be about 100 nm or more, and, in an embodiment, may be about 400 nm or more. As the thickness of the second buffer layer 347 is thicker, the light emission efficiency by the total reflection may increase.

The light filter layer 340 may be a filter transmitting light of a particular wavelength (e.g., a predetermined wavelength) and reflecting or absorbing light except for that of the particular wavelength. The light filter layer 340 may utilize reinforcement and/or offsetting interference between a layer having a high refractive index and a layer having a low refractive index to transmit and/or reflect the particular wavelength as described above. Particularly, the light filter layer 340 may reflect the light vertically incident to the light filter layer 340.

In an embodiment, the light filter layer 340 may include a structure in which high refractive index layers 340a and 340c having a high refractive index and a low refractive index layer 340b having a low refractive index are alternately stacked in plural. The present specification describes an exemplary embodiment in which the light filter layer 340 includes two high refractive index layers 340a and 340c and one low refractive index layer 340b; however, it is not limited thereto, and the light filter layer 340 may have a structure in which they are alternately stacked from several times to several tens of times.

The light filter layer 340 according to an exemplary embodiment includes the high refractive index layer 340a positioned adjacent to the second buffer layer 347 and the high refractive index layer 340c positioned adjacent to the over-coating layer 350. The high refractive index layers 340a and 340c may be positioned at the bottom end and the top end in the stacked structure of the light filter layer 340.

The low refractive index layer 340b included in the light filter layer 340 and the second buffer layer 347 having the relatively low refractive index may have different physical properties from each other. As one example, the low refractive index layer 340b may include a silicon oxide, and the second buffer layer 347 may also include a silicon oxide. In an embodiment, the low refractive index layer 340b may have a refractive index of about 1.4, and the second buffer layer 347 may include the porous layer, having the refractive index of lower than about 1.4. Even if the low refractive index layer 340b and the second buffer layer 347 include the same element, the physical properties (e.g., the refractive index, the density, the hardness, etc.) of the layers themselves may be different.

In the present specification, the second buffer layer 347 and the light filter layer 340 are described as separate constituent elements. However, the second buffer layer 347 may be seen as one layer included in the light filter layer 340, and in this case, the light filter layer 340 may have a structure in which the low refractive index layer and the high refractive index layer are alternately stacked based on the color conversion layers 330R and 330G. In this light filter layer 340, the low refractive index layer positioned closest to the color conversion layers 330R and 330G may be the porous layer, or a layer having a thickness of more than about 100 nm, and as one example, a thickness of more than about 400 nm.

Figure 5:
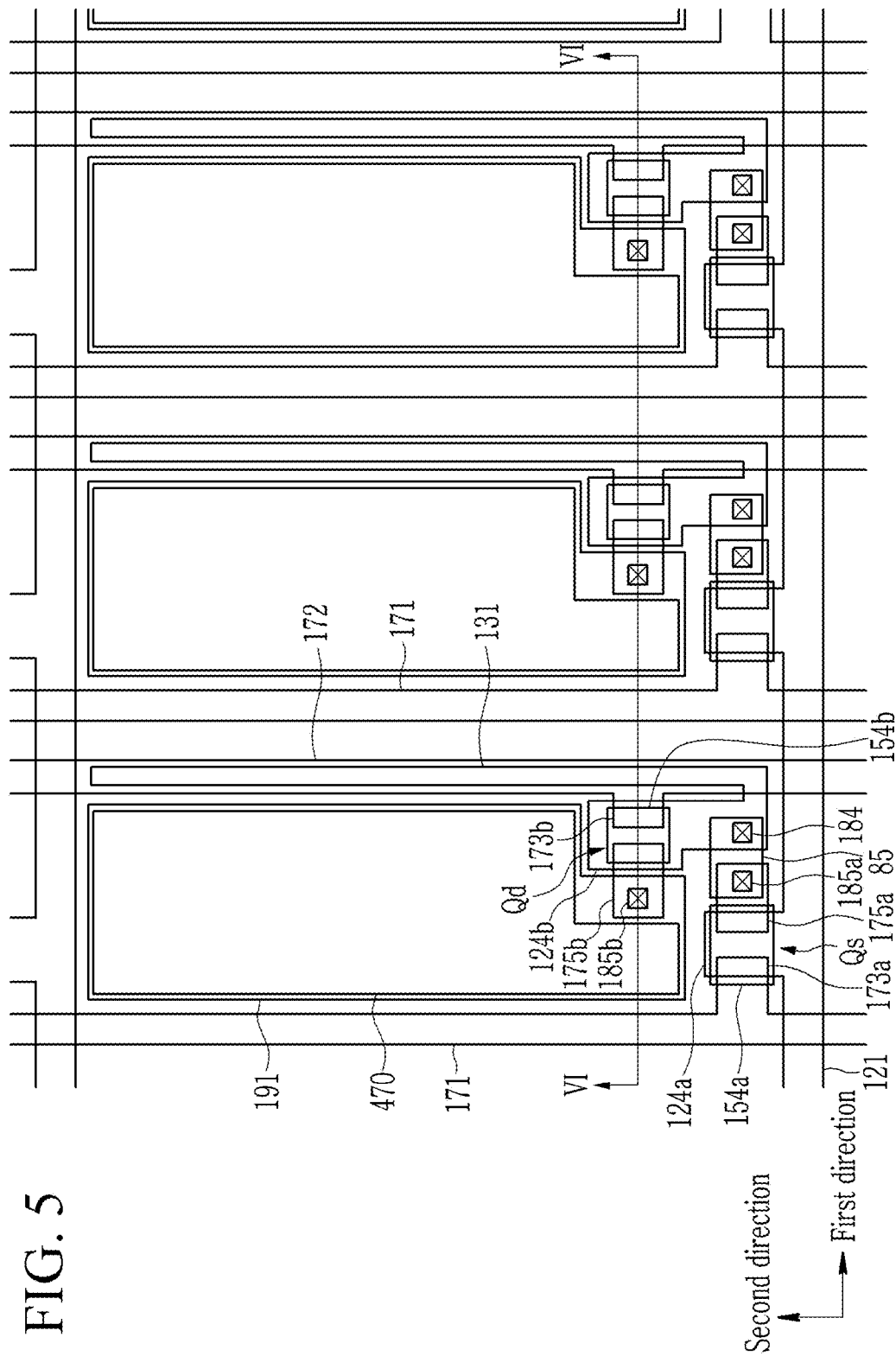
FIG. 5 is a top plan view of a pixel of a display device according to an exemplary embodiment.
Figure 6:
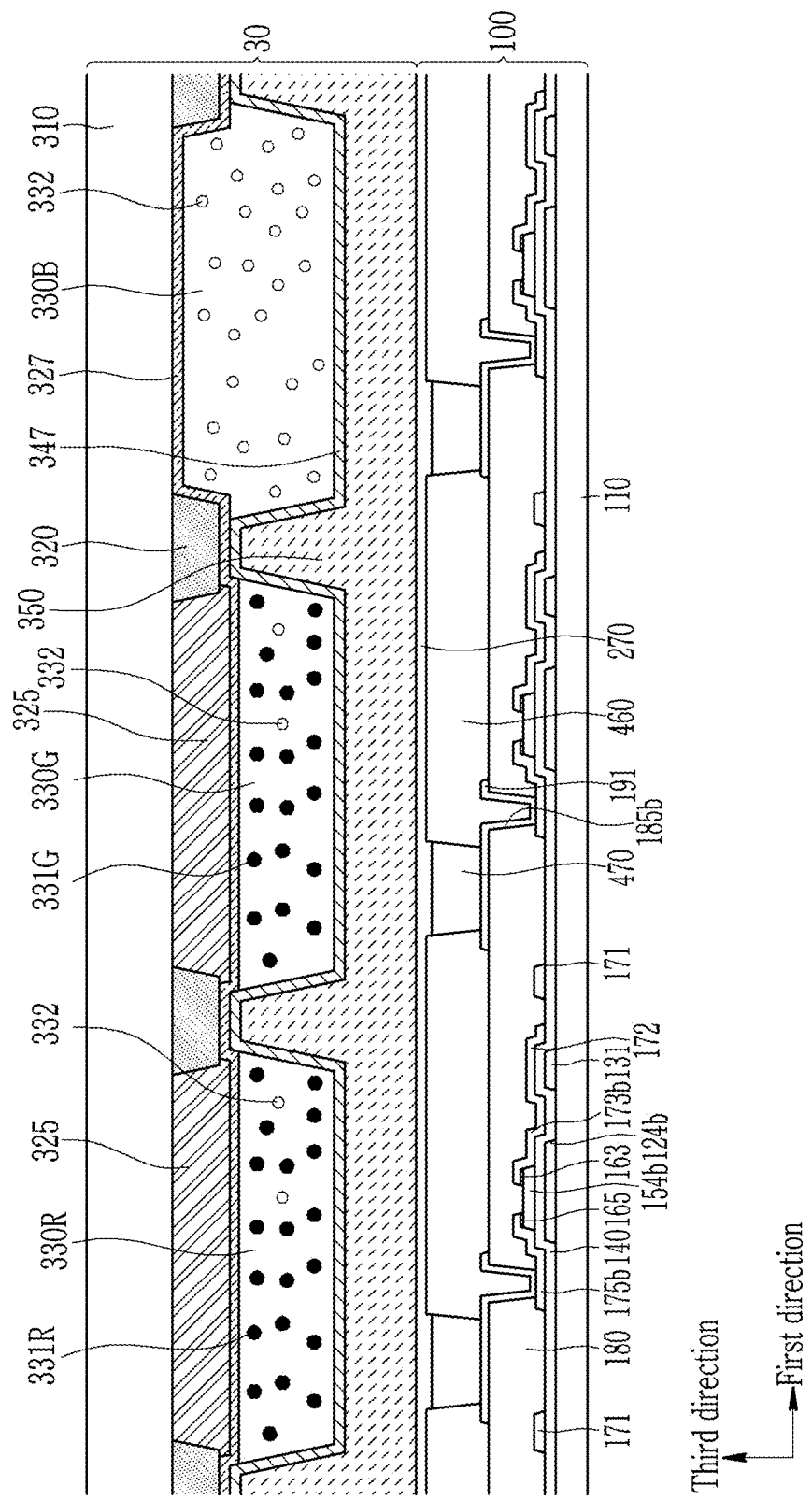
FIG. 6 is a cross-sectional view taken along a line VI-VI of FIG. 5.

Next, the display device according to an exemplary embodiment of the present invention will be described with reference to FIG. 5 and FIG. 6. FIG. 5 is a top plan view of a pixel of a display device according to an exemplary embodiment; and FIG. 6 is a cross-sectional view taken along a line VI-VI of FIG. 5. Description of the constituent elements that are the same as or similar to the above-described constituent elements may be omitted.

The thin film transistor array panel 100 includes a gate conductor including the gate line 121 positioned on the first substrate 110 and including a first gate electrode 124a, a second gate electrode 124b, and an extension 131 extending from the second gate electrode 124b.

The gate insulating layer 140 including a silicon nitride (SiNy) or a silicon oxide (SiOx) is positioned on the gate conductor (121, 124a, 124b, and 131).

A first semiconductor layer 154a and a second semiconductor layer 154b including amorphous silicon, polysilicon, or an oxide semiconductor are positioned on the gate insulating layer 140. The first semiconductor layer 154a and the second semiconductor layer 154b overlap the first gate electrode 124a and the second gate electrode 124b, respectively.

Ohmic contacts 163 and 165 are positioned on the first semiconductor layer 154a and the second semiconductor layer 154b. However, according to an exemplary embodiment, the ohmic contacts may be omitted.

A data conductor including a data line 171 including a first source electrode 173a, a driving voltage line 172 including a second source electrode 173b, a first drain electrode 175a, and a second drain electrode 175b is positioned on the ohmic contacts 163 and 165 and the gate insulating layer 140.

The first source electrode 173a and the first drain electrode 175a face each other based on the first gate electrode 124a, and the second source electrode 173b and the second drain electrode 175b face each other based on the second gate electrode 124b.

A passivation layer 180 is positioned on the data conductor (171, 172, 173a, 173b, 175a, and 175b) and the exposed semiconductor layers 154a and 154b.

The passivation layer 180 has contact holes 185a and 185b respectively overlapping the first drain electrode 175a and the second drain electrode 175b, and the passivation layer 180 and the gate insulating layer 140 have a contact hole 184 overlapping the second gate electrode 124b.

A pixel electrode 191 and a connecting member 85 are positioned on the passivation layer 180. The pixel electrode 191 is physically and electrically connected to the second drain electrode 175b through the contact hole 185b, and the connecting member 85 connects the second gate electrode 124b and the first drain electrode 175a through the contact holes 184 and 185a.

A partition 460 is positioned on the passivation layer 180. The partition 460 encloses an edge of the pixel electrode 191 like a bank, and is made of an organic insulator or an inorganic insulator.

An emission layer 470 is positioned on the pixel electrode 191. The emission layer 470 of an emissive display device according to the present exemplary embodiment may emit blue light.

In a case of a general emissive display device, the emission layer 470 includes a material uniquely emitting any one among primary colors, such as three primary colors of red, green, and blue, but in the emissive display device according to the present exemplary embodiment, the color conversion display panel 30 is positioned at the upper surface of the emissive display device to display each color of red, green, and blue, thereby including only the material emitting the blue light.

The present specification shows the emission layer 470 positioned to be separated for each pixel; however, it is not limited thereto, and the emission layer 470 positioned at adjacent pixels may be connected to each other. In an embodiment, the emission layer positioned at the region emitting the red light, the emission layer positioned at the region emitting the green light, and the emission layer positioned at the region emitting the blue light may be connected to each other.

A common electrode 270 is positioned on the emission layer 470.

In this emissive display device, the first gate electrode 124a connected to the gate line 121, the first source electrode 173a connected to the data line 171, and the first drain electrode 175a form a switching transistor Qs along with the first semiconductor layer 154a, and the channel of the switching transistor Qs is formed in the first semiconductor layer 154a between the first source electrode 173a and the first drain electrode 175a. The second gate electrode 124b connected to the first drain electrode 175a, the second source electrode 173b connected to the driving voltage line 172, and the second drain electrode 175b connected to the pixel electrode 191 form a driving transistor Qd along with the second semiconductor layer 154b, and the channel of the driving transistor Qd is formed in the second semiconductor layer 154b between the second source electrode 173b and the second drain electrode 175b. The pixel electrode 191, the emission layer 470, and the common electrode 270 form an organic light emitting diode (OLED), the pixel electrode 191 becomes an anode, and the common electrode 270 becomes a cathode; however, the pixel electrode 191 may become the cathode and the common electrode 270 may become the anode.

This emissive display device may emit the light upward and downward with respect to the first substrate 110 to display the image, and the exemplary embodiment in which the light is emitted upward with respect to the first substrate 110 is described according to an exemplary embodiment of the present invention.

The color conversion display panel 30 includes the substrate 310 overlapping the thin film transistor array panel 100. The light blocking member 320 is positioned between the substrate 310 and the thin film transistor array panel 100. The color conversion display panel 30 according to an exemplary embodiment is similar to the color conversion display panel 30 described above with reference to FIG. 2, and a repeated description of the constituent elements is omitted.

The light blocking member 320 may prevent or substantially prevent a mixture of different light emitted from adjacent pixels, and may define a region where the red color conversion layer 330R, the green color conversion layer 330G, and the transparent layer 330B are disposed.

The blue light cutting filter 325 may be positioned between the substrate 310 and the light blocking member 320, and the thin film transistor array panel 100. The blue light cutting filter 325 may be positioned between the red color conversion layer 330R and the substrate 310 and between the green color conversion layer 330G and the substrate 310. The blue light cutting filter 325 may overlap regions emitting red light and green light and may not overlap a region emitting blue light. The blue light cutting filter 325 may block the blue light supplied from the emission layer 470.

The first buffer layer 327 may include the material having the relatively low refractive index. In an embodiment, the first buffer layer 327 may have the lower refractive index than the color conversion layers 330R and 330G and the transparent layer 330B, and the refractive index of the first buffer layer 327 may be about 1.2 to about 1.4 as an example.

The first buffer layer 327 having the relatively low refractive index again returns the blue light that is not converted into red light or green light in the color conversion layers 330R and 330G and is emitted toward the substrate 310 side in the color conversion layers 330R and 330G direction by using the total reflection. In an embodiment, since the color conversion layers 330R and 330G have the relatively high refractive index and the first buffer layer 327 has the relatively low refractive index, total reflection of the blue light may be generated in the interface of the color conversion layers 330R and 330G and the first buffer layer 327.

The plurality of color conversion layers 330R and 330G and the transparent layer 330B may be positioned between the first buffer layer 327 and the thin film transistor array panel 100. The color conversion layers 330R and 330G and the transparent layer 330B may be repeatedly arranged along the first direction.

The plurality of color conversion layers 330R and 330G may include the red color conversion layer 330R and the green color conversion layer 330G. The transparent layer 330B does not convert the incident light and may emit the incident light as it is.

The red color conversion layer 330R may include the first semiconductor nanocrystal 331R converting the incident blue light into the red light. The green color conversion layer 330G may include the second semiconductor nanocrystal 331G converting the incident blue light into the green light.

At least one among the red color conversion layer 330R, the green color conversion layer 330G, and the transparent layer 330B may further include the scattering member 332. The scattering member 332 increases the amount of light that is converted or passes through the color conversion layers 330R and 330G and the transparent layer 330B and then is emitted, and may uniformly or substantially uniformly provide front luminance and lateral luminance.

The second buffer layer 347 is positioned between the color conversion layers 330R and 330G and the transparent layer 330B, and the thin film transistor array panel 100.

In an embodiment, the second buffer layer 347 may include a material having the relatively low refractive index. The second buffer layer 347 may have the lower refractive index than the color conversion layers 330R and 330G and the transparent layer 330B, and, as one example, the refractive index of the second buffer layer 347 may be about 1.2 to about 1.4.

As the display device according to an exemplary embodiment of the present invention includes the second buffer layer 347 having the relatively low refractive index, the total reflection may be generated at the interface of the color conversion layers 330R and 330G and the second buffer layer 347 and the interface of the transparent layer 330B and the second buffer layer 347. The totally-reflected light is emitted outside the substrate 310, thereby increasing the light emission efficiency of the display device. Also, the totally-reflected light is again incident to the semiconductor nanocrystals 331R and 331G, thereby increasing the conversion efficiency of the light.

The over-coating layer 350 is positioned between the second buffer layer 347 and the thin film transistor array panel 100. In an embodiment, the over-coating layer 350 may overlap the entire surface of the substrate 310. According to an exemplary embodiment, the over-coating layer 350 may be omitted, and a protection layer, an encapsulation layer, a sealant, etc. may be separately positioned between the second buffer layer 347 and the thin film transistor array panel 100.

Figure 7:
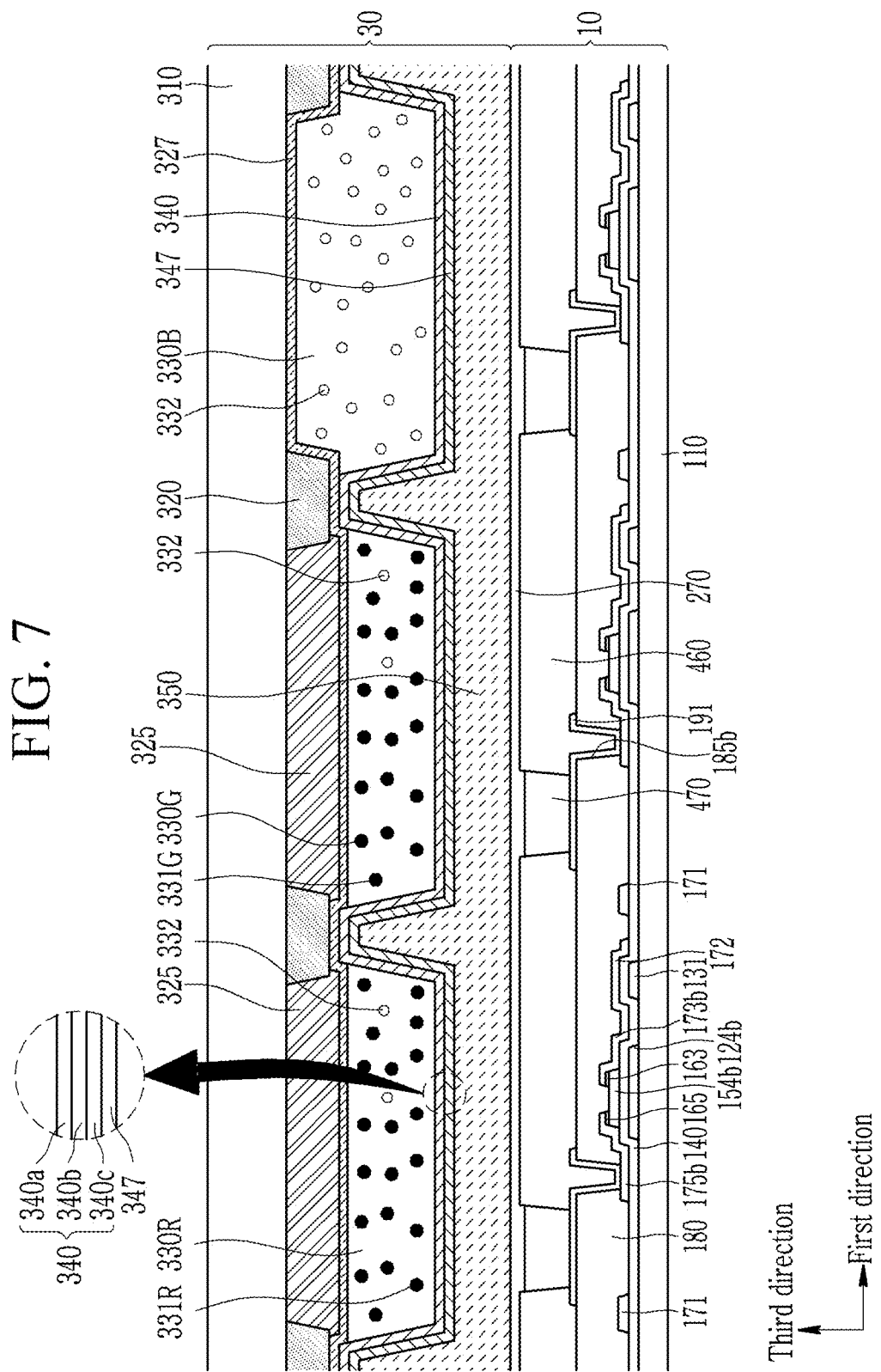
FIG. 7 and FIG. 8 are cross-sectional views taken along a line corresponding to that of FIG. 6 according to various exemplary embodiments, respectively.
Figure 8:
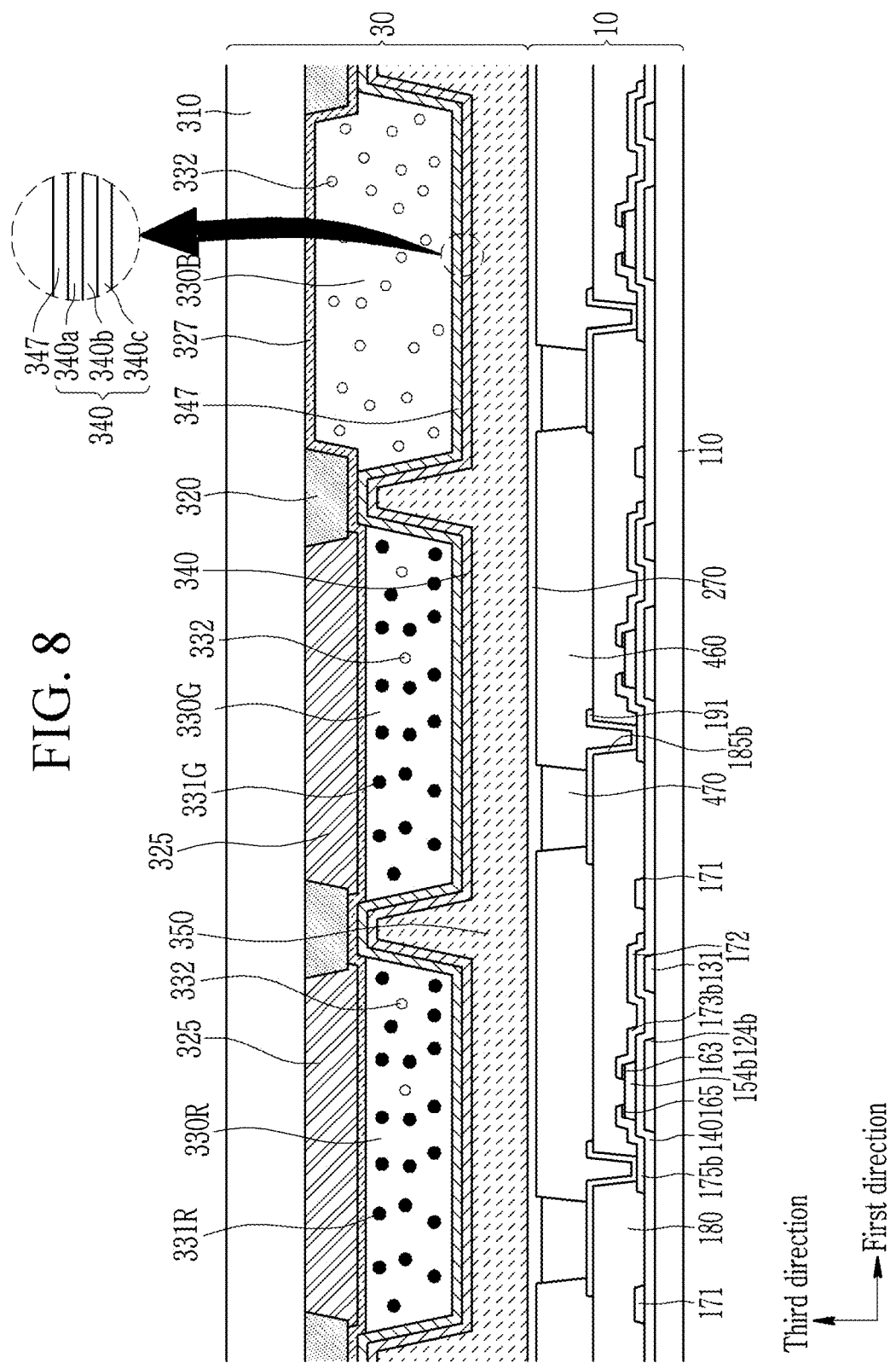

Next, the display device according to various exemplary embodiments of the present invention will be described with reference to FIG. 7 and FIG. 8. FIG. 7 and FIG. 8 are cross-sectional views taken along a line corresponding to that of FIG. 6 according to various exemplary embodiments, respectively. Description of the constituent elements that are similar to or the same as the above-described exemplary embodiment is omitted.

Referring to FIG. 7, the color conversion display panel 30 is positioned on the thin film transistor array panel 100 described with reference to FIG. 6. The thin film transistor array panel 100 is described with reference to FIG. 5 and FIG. 6, and repeated description thereof is omitted.

The color conversion display panel 30 according to an exemplary embodiment may further include the light filter layer 340 positioned between the color conversion layers 330R and 330G and the second buffer layer 347 and between the transparent layer 330B and the second buffer layer 347.

In an embodiment, the light filter layer 340 may include the structure in which high refractive index layers 340a and 340c having a high refractive index and a low refractive index layer 340b having a low refractive index are alternately stacked in plural. The present specification describes the exemplary embodiment in which the light filter layer 340 includes two high refractive index layers 340a and 340c and one low refractive index layer 340b; however, it is not limited thereto, and the light filter layer 340 may have a structure in which they are alternately stacked from several times to several tens of times.

The light filter layer 340 according to an exemplary embodiment includes the high refractive index layer 340a positioned adjacent to the color conversion layers 330R and 330G and the transparent layer 330B, and the high refractive index layer 340c positioned adjacent to the second buffer layer 347. The high refractive index layers 340a and 340c may be positioned at the bottom end and the top end in the stacked structure of the light filter layer 340.

In an embodiment, the low refractive index layer 340b included in the light filter layer 340, and the first buffer layer 327 and the second buffer layer 347 having the relatively low refractive index may have different physical properties from each other. As one example, the low refractive index layer 340b may include a silicon oxide, and the first buffer layer 327 and the second buffer layer 347 may also include a silicon oxide. In an embodiment, the low refractive index layer 340b may have the refractive index of about 1.4, and the first buffer layer 327 and the second buffer layer 347 include the porous layer, thereby having the lower refractive index than about 1.4. Even if the low refractive index layer 340b and the first and second buffer layers 327 and 347 include the same element, the physical properties (e.g., the refractive index, the density, the hardness, etc.) of the layers themselves may be different.

The constituent elements of the color conversion display panel 30 according to the exemplary embodiment of FIG. 7 is similar to the color conversion display panel 30 according to the exemplary embodiment of FIG. 3, and repeated description thereof is omitted.

Next, referring to FIG. 8, the color conversion display panel 30 is positioned on the thin film transistor array panel 100 described with reference to FIG. 5 and FIG. 6.

The color conversion display panel 30 according to an exemplary embodiment may sequentially include the second buffer layer 347 and the light filter layer 340 positioned between the color conversion layers 330R and 330G and the over-coating layer 350, and between the transparent layer 330B and the over-coating layer 350. The second buffer layer 347 may be positioned adjacent to the color conversion layers 330R and 330G and the transparent layer 330B, and the light filter layer 340 may be positioned adjacent to the over-coating layer 350.

The color conversion display panel 30 according to the exemplary embodiment of FIG. 8 is similar to the color conversion display panel 30 according to the exemplary embodiment of FIG. 4, and repeated description thereof is omitted.

Figure 9:
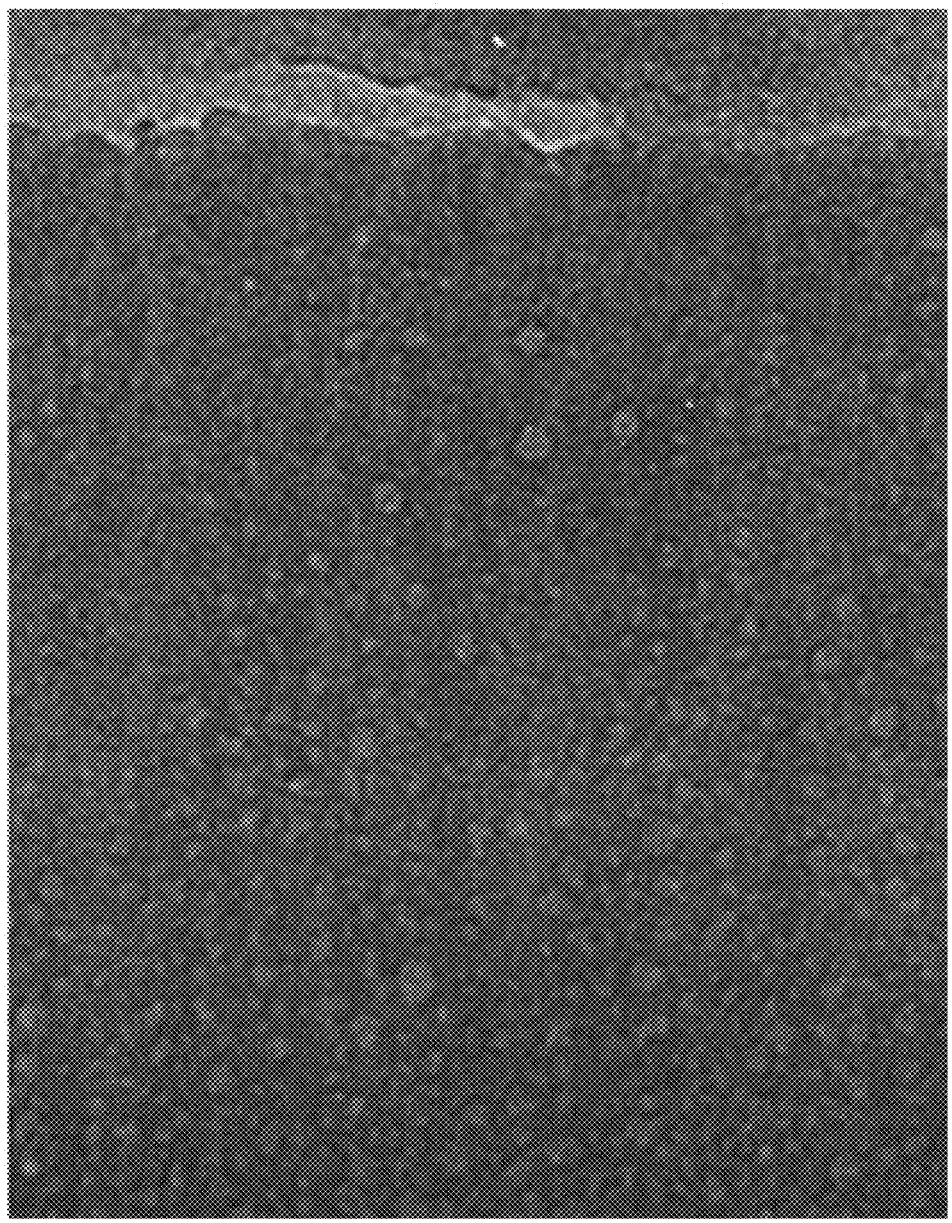
FIG. 9 is a view showing an image of a buffer layer according to an exemplary embodiment.
Figure 10:
FIG. 10 is a view showing an image of a buffer layer according to a comparative example.
Figure 11:
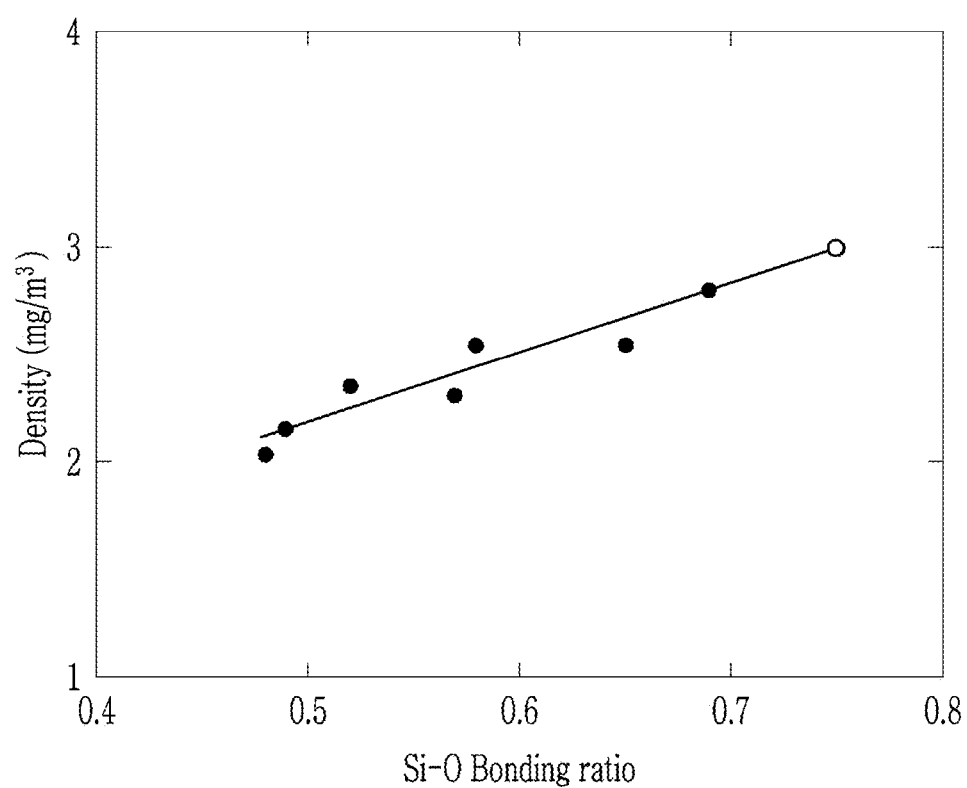
FIG. 11 is a graph showing a density of a buffer layer depending on a ratio of Si—O bonds included in a buffer layer.
Figure 12:
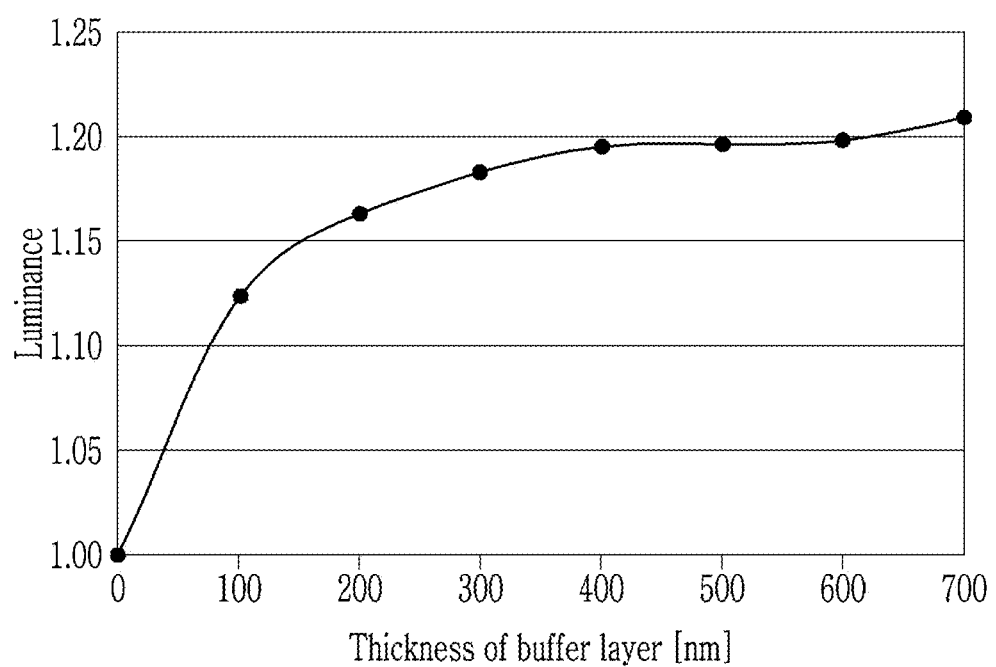
FIG. 12 is a graph showing luminance depending on a thickness of a buffer layer.

Next, the buffer layer according to an exemplary embodiment will be described with reference to FIG. 9 to FIG. 12. FIG. 9 is a view showing an image of a buffer layer according to an exemplary embodiment; FIG. 10 is a view showing an image of a buffer layer according to a comparative example; FIG. 11 is a graph showing a density of a buffer layer depending on Si—O bonding in a buffer layer; and FIG. 12 is a graph showing a luminance depending on a thickness of a buffer layer.

As shown in FIG. 9, the buffer layer according to an exemplary embodiment may be the porous layer including the plurality of pores. This may be provided by controlling the deposition speed of the layer, and the refractive index of about 1.3 to 1.4 appears.

By contrast, FIG. 10 is an image showing a layer containing no pores even if a same material such as a silicon oxide is included, and, in this case, it is confirmed that the layer has a high refractive index compared with an exemplary embodiment of the present invention.

Also, referring to FIG. 11, as the number of pores included in the layer increases, the number of Si—O bonds decreases, and, accordingly, it is confirmed that the density of the layer itself decreases. Therefore, it may be confirmed that the buffer layer according to an exemplary embodiment of the present invention has the lower density than the low refractive index layer included in the light filter layer or the color conversion layer.

On the other hand, referring to FIG. 12, it may be confirmed that the light efficiency of light emitted outside the display device may increase as the thickness of the buffer layer according to an exemplary embodiment increases. Particularly, it may be confirmed that the thickness of the buffer layer may be at least 100 nm or more to obtain a luminance increasing effect of 10% or more, and the thickness of the buffer layer may be about 400 nm or more to obtain the luminance increasing effect of about 20%.

According to the above-described exemplary embodiments, the light emission efficiency of light emitted outside the display device may increase and the color reproducibility may be improved.

While this invention has been described in connection with what are presently considered to be some practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a thin film transistor array panel; and
   a color conversion display panel overlapping the thin film transistor array panel,
   wherein the color conversion display panel includes:
   a substrate;
   a color conversion layer positioned between the substrate and the thin film transistor array panel and including a semiconductor nanocrystal;
   a transparent layer positioned between the substrate and the thin film transistor array panel; and
   a first buffer layer positioned between the color conversion layer and the substrate and between the transparent layer and the substrate, and a second buffer layer positioned between the color conversion layer and the thin film transistor array panel and between the transparent layer and the thin film transistor array panel, and
   the first buffer layer and the second buffer layer includes a porous layer, and
   both the first buffer layer and the second buffer layer continuously overlap the color conversion layer and the transparent layer.

2. The display device of claim 1, wherein the first buffer layer and the second buffer layer has a lower refractive index than a refractive index of the color conversion layer and the transparent layer.

3. The display device of claim 1, further comprising a light filter layer positioned between the second buffer layer and the color conversion layer and between the second buffer layer and the transparent layer.

4. The display device of claim 3, wherein the light filter layer includes a plurality of layers including at least one high refractive index layer and at least one low refractive index layer that are alternately stacked.

5. The display device of claim 4, wherein the first buffer layer and the second buffer layer have a different refractive index from a refractive index of the at least one low refractive index layer.

6. The display device of claim 4, wherein the at least one high refractive index layer is positioned adjacent to the second buffer layer.

7. The display device of claim 4, wherein the at least one high refractive index layer is positioned at a top end and a bottom end of the light filter layer.

8. The display device of claim 1, further comprising:
   an over-coating layer positioned between the second buffer layer and the thin film transistor array panel; and
   a light filter layer positioned between the second buffer layer and the over-coating layer.

9. The display device of claim 1, wherein a thickness of the first buffer layer and the second buffer layer is 100 nm or more.

10. The display device of claim 9, wherein the thickness of the first buffer layer and the second buffer layer is 400 nm or more.

11. The display device of claim 1, wherein a refractive index of the first buffer layer and the second buffer layer is 1.2 to 1.4.

12. The display device of claim 1, wherein a refractive index of the first buffer layer and the second buffer layer is decreased as a number of pores included in the first buffer layer and the second buffer layer is increased.

13. The display device of claim 1, wherein
    at least one of the first buffer layer and the second buffer layer includes a silicon oxide, and
    a refractive index of the first buffer layer and the second buffer layer is decreased as a number of Si—O bonds included in the first buffer layer and the second buffer layer is decreased.

14. A display device comprising:
    a thin film transistor array panel; and
    a color conversion display panel overlapping the thin film transistor array panel,
    wherein the color conversion display panel includes:
    a substrate;
    a color conversion layer positioned between the substrate and the thin film transistor array panel and including a semiconductor nanocrystal;
    a transparent layer positioned between the substrate and the thin film transistor array panel; and
    a first buffer layer positioned between the color conversion layer and the substrate and between the transparent layer and the substrate, and a second buffer layer positioned between the color conversion layer and the thin film transistor array panel and between the transparent layer and the thin film transistor array panel, and
    total reflection of light is generated at at least one of an interface between the color conversion layer and the first buffer layer and an interface between the color conversion layer and the second buffer layer, and
    both the first buffer layer and the second buffer layer continuously overlap the color conversion layer and the transparent layer.

15. The display device of claim 14, wherein the first buffer layer and the second buffer layer have a refractive index that is lower than a refractive index of the color conversion layer and the transparent layer.

16. The display device of claim 14, further comprising:
    an over-coating layer positioned between the second buffer layer and the thin film transistor array panel; and
    a light filter layer positioned at one of between the color conversion layer and the second buffer layer and between the second buffer layer and the over-coating layer.

17. The display device of claim 16, wherein
    the light filter layer includes a plurality of layers including at least one high refractive index layer and at least one low refractive index layer that are alternately stacked, and
    the at least one high refractive index layer is positioned at a top end and a bottom end of the light filter layer.

18. The display device of claim 14, wherein one of the first buffer layer and the second buffer layer includes a porous inorganic material, and the other of the first buffer layer and the second buffer layer includes an organic layer including an inorganic particle.

19. The display device of claim 18, wherein the inorganic particle includes at least one among hollow silica, a pore derivative, and a silica cluster.

20. The display device of claim 14, wherein a refractive index of the first buffer layer and the second buffer layer is 1.2 to 1.4.

* * * * *